United States Patent
Tsuji et al.

(10) Patent No.: US 9,236,248 B2
(45) Date of Patent: Jan. 12, 2016

(54) FABRICATION METHOD OF SILICON CARBIDE SEMICONDUCTOR ELEMENT

(71) Applicant: FUJI ELECTRIC CO., LTD., Kawasaki-shi, Kanagawa (JP)

(72) Inventors: Takashi Tsuji, Tsukuba (JP); Kenji Fukuda, Tsukuba (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 14/397,141

(22) PCT Filed: Mar. 18, 2013

(86) PCT No.: PCT/JP2013/057744
§ 371 (c)(1),
(2) Date: Oct. 24, 2014

(87) PCT Pub. No.: WO2013/161450
PCT Pub. Date: Oct. 31, 2013

(65) Prior Publication Data
US 2015/0111368 A1    Apr. 23, 2015

(30) Foreign Application Priority Data
Apr. 27, 2012   (JP) ................. 2012-104236

(51) Int. Cl.
*H01L 21/20* (2006.01)
*H01L 21/02* (2006.01)
(Continued)

(52) U.S. Cl.
CPC ........ *H01L 21/02378* (2013.01); *C30B 25/186* (2013.01); *C30B 25/20* (2013.01);
(Continued)

(58) Field of Classification Search
CPC ............. H01L 21/02378; H01L 21/02609; H01L 21/02491; H01L 23/544
USPC ........................................... 438/478
See application file for complete search history.

(56) References Cited

U.S. PATENT DOCUMENTS

| | | | |
|---|---|---|---|
| 2006/0211210 A1* | 9/2006 | Bhat et al. | 438/377 |
| 2008/0050876 A1* | 2/2008 | Matocha et al. | 438/269 |
| 2010/0199910 A1 | 8/2010 | Watanabe et al. | |
| 2010/0295062 A1 | 11/2010 | Uchida et al. | |
| 2012/0302051 A1* | 11/2012 | Matsuno et al. | 438/571 |

FOREIGN PATENT DOCUMENTS

| | | |
|---|---|---|
| JP | 10-120497 A | 5/1998 |
| JP | 2003-142357 A | 5/2003 |

(Continued)

OTHER PUBLICATIONS

Kimoto et al., "Growth mechanism of 6HSiC in stepcontrolled epitaxy", Journal of Applied Physics, vol. 73, No. 2, 1993, pp. 726-732; cited in the Specification.

(Continued)

*Primary Examiner* — Reema Patel
*Assistant Examiner* — Syed Gheyas
(74) *Attorney, Agent, or Firm* — Westerman, Hattori, Daniels & Adrian, LLP

(57) ABSTRACT

A (000-1) C-plane of an n⁻ type silicon carbide substrate having an off-angle θ in a <11-20> direction is defined as a principal plane, and a periphery of a portion of this principal surface layer defined as an alignment mark is selectively removed to leave the convex-shaped alignment mark. The alignment mark has a cross-like plane shape such that two rectangles having longitudinal dimensions tilted by 45 degrees relative to the <11-20> direction are orthogonal to each other. When a film thickness of a p⁻ type epitaxial layer is Y; a width of the alignment mark parallel to the principal surface of the n⁻ type silicon carbide substrate is X; and an off-angle of the n⁻ type silicon carbide substrate is θ, an epitaxial layer is formed on an upper surface of the alignment mark such that Y≥X·tan θ is satisfied.

6 Claims, 5 Drawing Sheets

(51) Int. Cl.
    *C30B 25/20*     (2006.01)
    *H01L 29/04*     (2006.01)
    *H01L 29/16*     (2006.01)
    *C30B 25/18*     (2006.01)
    *C30B 29/36*     (2006.01)
    *H01L 23/544*     (2006.01)
    *H01L 29/861*     (2006.01)
    *H01L 29/872*     (2006.01)

(52) U.S. Cl.
    CPC ........... *C30B 29/36* (2013.01); *H01L 21/0243* (2013.01); *H01L 21/02433* (2013.01); *H01L 21/02491* (2013.01); *H01L 21/02529* (2013.01); *H01L 21/02609* (2013.01); *H01L 23/544* (2013.01); *H01L 29/045* (2013.01); *H01L 29/1608* (2013.01); *H01L 29/861* (2013.01); *H01L 29/872* (2013.01); *H01L 2223/5442* (2013.01); *H01L 2223/5446* (2013.01); *H01L 2223/54426* (2013.01); *H01L 2924/0002* (2013.01)

(56) References Cited

FOREIGN PATENT DOCUMENTS

| | | |
|---|---|---|
| JP | 2004-36655 A | 2/2004 |
| JP | 2005-19898 A | 1/2005 |
| JP | 2007-281157 A | 10/2007 |
| JP | 2007281157 A * | 10/2007 |
| JP | 2008-53363 A | 3/2008 |
| JP | 2010-184829 A | 8/2010 |
| JP | 2011-100928 A | 5/2011 |
| WO | 2010/004715 A1 | 1/2010 |

OTHER PUBLICATIONS

International Search Report dated Jun. 18, 2013 issued in corresponding application No. PCT/JP2013/057744.
Notification of Transmittal of Translation of the International Preliminary Report on Patentability (Chapter I or Chapter II) (Form PCT/IB/338) of the International Application No. PCT/JP2013/057744 mailed Nov. 6, 2014 with Forms PCT/IB/373, PCT/IB/326 and PCT/ISA/237. (17 pages).

* cited by examiner

FABRICATION METHOD OF SILICON CARBIDE SEMICONDUCTOR ELEMENT

TECHNICAL FIELD

The present invention relates to a fabrication method of a silicon carbide semiconductor element using silicon carbide (SiC) as a semiconductor material, particularly, to which current is applied from a front surface side to a back surface side of a semiconductor substrate.

BACKGROUND ART

A silicon carbide semiconductor has a large band gap as compared to a silicon (Si) semiconductor and therefore, has high dielectric breakdown electric field intensity. ON-resistance is resistance in a conductive state and is inversely proportional to the cube of the dielectric breakdown electric field intensity and therefore, for example, widely used silicon carbide semiconductors called a 4H type (four-layer cycle hexagonal crystals: 4H—SiC) can suppress the ON-resistance to a few hundredth as compared to silicon semiconductors.

Therefore, also because of large thermal conductivity characteristics facilitating heat radiation, silicon carbide semiconductors are expected as a next-generation, low-loss, power semiconductor device. For example, a silicon carbide semiconductor is used for developing silicon carbide semiconductor elements of various structures such as Schottky barrier diodes, insulated gate field-effect transistors (MOSFET), PN diodes, insulated gate bipolar transistors (IGBTs), and gate turn-off thyristors (GTO).

Multiple photomasks are necessary for producing such semiconductor elements. The photomasks are used in a process of dry etching of silicon carbide, a process of ion implantation into silicon carbide, a process of forming a contact hole of an oxide film, and a process of forming electrode patterns such as a source electrode, a gate electrode, and an emitter electrode. To automatically align the photomasks and a semiconductor substrate in the processes, an alignment mark acting as a position recognition target is first formed on a surface of a silicon carbide substrate. A conventional alignment mark forming process will be described with reference to FIGS. 5 and 6.

FIG. 5 is a cross-sectional view of a state of the silicon carbide substrate during conventional alignment mark formation. FIG. 6 is a cross-sectional view of a state of the silicon carbide substrate after conventional alignment mark formation. First, as depicted in FIG. 5, in a first process of producing an element structure of a silicon carbide semiconductor element, an oxide layer 102 with a sufficiently thick film thickness is formed on a silicon carbide substrate 101 and a photoresist 103 is then applied to a surface of the oxide layer 102. The photoresist 103 is irradiated with (exposed to) ultraviolet light through a photomask provided with an alignment mark.

The photoresist 103 in an exposed portion is removed by immersion in developer. As a result, the photoresist 103 in an unexposed portion remains in the same pattern as the photomask. The remaining photoresist 103 is baked to cure. The remaining photoresist 103 is used as a mask to remove the oxide layer 102 exposed in an opening portion of the photoresist 103 through dry etching using methane trifluoride ($CHF_3$), etc. as the main raw material gas.

As depicted in FIG. 6, the photoresist 103 is entirely removed by ashing. The oxide layer 102 is used as a mask to remove the silicon carbide substrate 101 exposed in an opening portion of the oxide layer 102 to a depth of about 1 to 2 μm through dry etching using fluorine sulfide ($SF_6$), carbon tetrafluoride ($CF_4$), etc. as main raw material gas. As a result, a concave-shaped alignment mark 104 is formed in the silicon carbide substrate 101. Subsequently, the oxide layer 102 is removed through wet etching using buffered hydrofluoric acid (BHF: buffered hydrogen fluoride) etc.

The alignment mark 104 is formed not only in the oxide layer 102 but also in the silicon carbide substrate 101 in this way because the oxide layer 102 must be removed to leave only the silicon carbide substrate 101 for an annealing step executed at a temperature of 1500 degrees C. or higher for the purpose of activation of ion implantation species implanted into the silicon carbide substrate 101. If the annealing step is executed in a state in which the oxide layer 102 is formed on the silicon carbide substrate 101, the oxide layer 102 evaporates due to the high annealing temperature of 1500 degrees C., causing a problem that the silicon carbide substrate 101 is etched when the oxide layer 102 evaporates.

In an example of a fabrication method of a silicon carbide semiconductor element, after an alignment mark is formed in the silicon carbide substrate, an epitaxial layer may be grown on a surface of the silicon carbide semiconductor provided with the alignment mark. For example, a base layer of a MOSFET is generally formed by ion implantation and is known as being formed by epitaxial growth in which crystals are enlarged while atomic arrangement of the crystals is maintained. A method has been proposed for forming a base layer of a MOSFET through epitaxial growth and suppressing crystal defects in the base layer to improve mobility of carriers flowing through an inversion layer (channel) (see Patent Document 1).

The epitaxial layer grown on a principal surface of the silicon carbide substrate 101 will be described. FIG. 7 is a schematic explanatory view of a state of the principal surface of the silicon carbide substrate for epitaxial growth. To grow an epitaxial layer with fewer defects, a <0001> c-axis of the silicon carbide substrate 101 must be tilted slightly from a normal line N direction of a principal surface 110 in a <11-20> direction. FIG. 7 depicts a state in which the axis is tilted from the normal line N direction of the principal surface 110 by α degrees in the <11-20> direction. In this case, since a stepped {0001} c-plane emerges on the principal surface 110 of the silicon carbide substrate 101, the principal surface 110 of the silicon carbide substrate 101 includes a {0001} c-plane terrace portion 111 having a weak interatomic bonding force and a step portion 112 having a strong interatomic bonding force.

A growth mechanism of the epitaxial layer includes a combination of reactions such as adsorption of Si atoms and carbon (C) atoms onto the principal surface of the silicon carbide substrate, surface migration (diffusion) and binding of the adsorbed atoms, and desorption (sublimation) of the adsorbed atoms from the principal surface of the silicon carbide substrate. The probability of occurrence of these reactions varies depending on growth conditions such as a substrate temperature and a pressure of raw material gas and changes a growth rate and a crystal defect density in the epitaxial layer. To grow a high-quality epitaxial layer with a lower crystal defect density, it is proposed that growth conditions must be achieved so as to suppress epitaxial growth in the terrace portion 111 and facilitate epitaxial growth in the step portion 112 (see Non-Patent Literature 1).

The epitaxial growth in the terrace portion 111 is epitaxial growth in the <0001> c-axis direction (vertical direction) around a nucleus formed by an atom adsorbed on the terrace portion 111. In this case, the vertical layering sequence of atoms in a 4H structure of a principal surface of an underlying silicon carbide substrate is not reflected. This generally results in an epitaxial layer including cubic silicon carbide (3C—SiC) formed on the principal surface of the underlying silicon carbide substrate. Since 3C—SiC does not have a sufficiently high material physical property as compared to 4H—SiC, the element performance expected of vertical power device semiconductor elements cannot be realized.

On the other hand, in the epitaxial growth in the step portion 112, the epitaxial growth proceeds in the <11-20> direction (lateral direction) such that the step portion 112 is defined as the origin for each of atomic layers in the {0001} c-plane. Therefore, an epitaxial layer is formed that directly takes over the 4H structure of the principal surface of the underlying silicon carbide substrate. To facilitate the epitaxial growth in the step portion 112, a surface migration length of absorbed atoms on the surface of the step portion 112 must be increased. Therefore, an increased substrate temperature and a reduced gas pressure are mainly implemented during epitaxial growth. Such an epitaxial growth mode will hereinafter be referred to as step-flow growth.

Patent Document 1: Japanese Laid-Open Patent Publication No. 2004-036655

Non-Patent Literature 1: T. Kimoto, et al, "Growth mechanism of 6H—SiC in step-controlled epitaxy", Journal of Applied Physics, Volume 73, Issue 2, pp. 726-732, January 1993

DISCLOSURE OF INVENTION

Problem to be Solved by the Invention

Nonetheless, if an epitaxial layer is grown after an alignment mark is formed on a principal surface of a silicon carbide substrate, it is problematic that a contour of the alignment mark changes before and after the epitaxial layer growth. The reason is as follows. FIG. 3 is a cross-sectional view of a state of a conventional alignment mark after epitaxial layer formation. FIGS. 4A and 4B are schematic plane views of a plane shape of the conventional alignment mark after epitaxial layer formation. Hereinafter, with regard to the <11-20> directions, a direction of growth of a crystal phase will be referred to as a downstream side and a direction opposite to the direction of growth of a crystal phase will be referred to as an upstream side.

As depicted in FIG. 3, an epitaxial layer 121 is formed on a principal surface of the silicon carbide substrate 101 along a side wall and a bottom surface of an alignment mark 104 that is an etching portion of the silicon carbide substrate 101. In this case, almost no change is made in a position of an upper part 121a of a side wall of an alignment mark 104a newly formed by the epitaxial layer 121 covering the side wall on the upstream side of the <11-20> direction of the alignment mark 104. On the other hand, on the downstream side of the <11-20> direction of the alignment mark 104, the epitaxial growth does not proceed in the vicinity of an upper part 121b of the side wall of the alignment mark 104 and a thickness of the epitaxial layer 121 becomes thinner than the other portions. As a result, a position of an upper part 121c of the side wall of the newly formed alignment mark 104a is significantly shifted in the downstream direction.

Therefore, as depicted in FIGS. 4A and 4B, when a contour of a conventional alignment mark has a cross-like plane shape including a rectangle having a longitudinal direction parallel to the <11-20> direction and a rectangle having a longitudinal direction parallel to the <1-100> direction orthogonal to each other, the contour is changed between before the formation of the epitaxial layer 121 (FIG. 4A) and after the formation of the epitaxial layer 121 (FIG. 4B). If the contour of the alignment mark is changed in this way, a position of the alignment mark 104 at a step executed after the formation of the alignment mark 104 and before the formation of the epitaxial layer 121 becomes different from a position of the alignment mark 104a at a step executed after the formation of the epitaxial layer 121, in image recognition by an exposure device.

It is confirmed as a result of intensive research by the present inventors that a deviation amount of the position of the alignment mark 104a newly formed after the formation of the epitaxial layer 121 (hereinafter simply referred to as an alignment mark deviation amount) depends on the film thickness of the epitaxial layer 121 and is not constant. Since the alignment mark deviation amount is not constant, if element design is performed in consideration of the alignment mark deviation amount, it is problematic that reductions in the size of an element becomes difficult and that ON-resistance cannot be reduced. It is also problematic that even if reductions in the size of an element are achieved, the element does not operate properly.

It is an object of the present invention to provide a fabrication method of a silicon carbide semiconductor device enabling reductions in the size of an element to be achieved so as to eliminate the problems of the conventional techniques described above.

Means for Solving Problem

To solve the problems above and achieve an object, a fabrication method of a silicon carbide semiconductor element includes defining a plane of a silicon carbide substrate having a <0001> c-axis tilted by θ from a normal line direction of a principal plane of the silicon carbide substrate in a <11-20> direction as the principal plane and removing a principal surface layer of the silicon carbide substrate such that a periphery of a region in which an alignment mark is provided is surrounded so as to leave a convex-shaped alignment mark; and growing an epitaxial layer on the principal surface layer of the silicon carbide substrate to cover the alignment mark, where a width X of the alignment mark parallel to the principal surface of the silicon carbide substrate satisfies Y≥X·tan θ in terms of a relationship with a film thickness Y of the epitaxial layer.

To solve the problems above and achieve an object, a fabrication method of a silicon carbide semiconductor element includes defining a plane of a silicon carbide substrate having a <0001> c-axis tilted by θ from a normal line direction of a principal plane of the silicon carbide substrate in a <11-20> direction as the principal plane and coating with a tantalum carbide film, a region of a principal surface layer of the silicon carbide substrate other than a region in which an alignment mark is provided; growing a convex-shaped first epitaxial layer acting as an alignment mark on the principal surface of the silicon carbide substrate, on a side coated with the tantalum carbide film; removing the tantalum carbide film; and growing a second epitaxial layer on the principal surface of the silicon carbide substrate to cover the alignment mark, where a width X of the alignment mark parallel to the principal surface of the silicon carbide substrate satisfies Y≥X·tan θ in terms of a relationship with a film thickness Y of the second epitaxial layer.

Further, to solve the problems above and achieve an object, a fabrication method of a silicon carbide semiconductor element includes defining a plane of a silicon carbide substrate having a <0001> c-axis tilted from a normal line direction of a principal plane of the silicon carbide substrate to a <11-20> direction as the principal plane and selectively removing a principal surface layer of the silicon carbide substrate to form a concave-shaped alignment mark; coating with a tantalum carbide film, a region of the principal surface of the silicon carbide substrate including the alignment mark; and growing an epitaxial layer on the principal surface of the silicon carbide substrate selectively coated with the tantalum carbide film.

Further in the inventions above, according to the fabrication method of a silicon carbide semiconductor element of the present invention, the alignment mark is formed in a cross-like plane shape such that two rectangles having longitudinal dimensions tilted by 45 degrees relative to the <11-20> direction are orthogonal to each other.

According to the invention described above, positional deviation of the alignment mark and deformation of the contour of the alignment mark do not occur before or after the formation of the epitaxial layer on the upper surface of the alignment mark. As a result, when the alignment mark is use as a position recognition target of photomasks and is recognized as an image by a stepper, the contour of the alignment mark can correctly be recognized by the stepper.

Effect of the Invention

The fabrication method of a silicon carbide semiconductor element according to the present invention produces an effect that enables reductions in the size of an element.

BEST MODE(S) FOR CARRYING OUT THE INVENTION

Figure 1A:
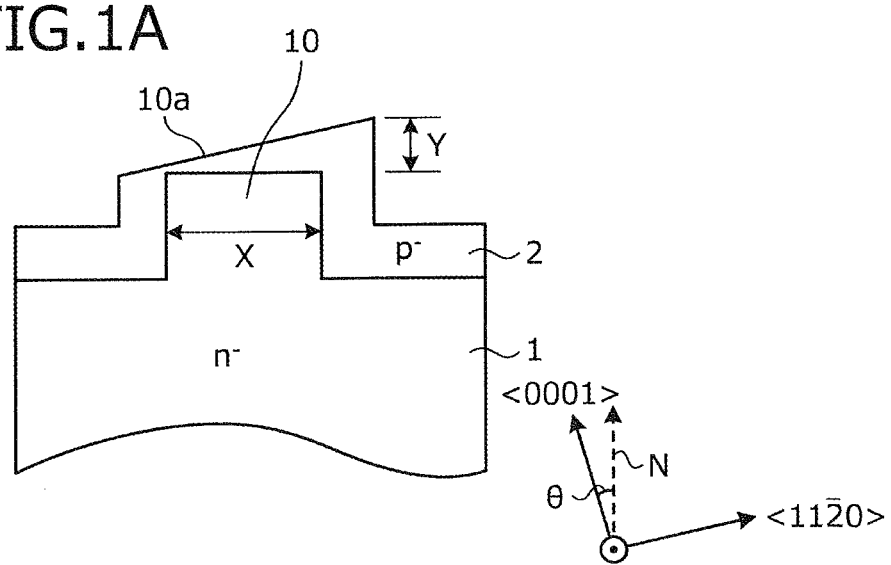
FIGS. 1A and 1B are explanatory views of a state during fabrication of silicon carbide semiconductor element according to a first embodiment of the present invention.

Preferred embodiments of a fabrication method of a silicon carbide semiconductor element according to the present invention will be described in detail with reference to the accompanying drawings. In this description and the accompanying drawings, layers and regions prefixed with n or p mean that majority carriers are electrons or positive holes, respectively. Additionally, + and − added to n or p mean that impurity concentration is higher and lower, respectively, than layers and regions without + and −. In the following description of the embodiments and the accompanying drawings, the same constituent elements are denoted by the same reference numerals and will not repeatedly be described. In this description, when Miller indices are described, "−" means a bar added to an index immediately after the "−", and a negative index is represented by prefixing "−" to the index.

First Embodiment

Figure 1B:
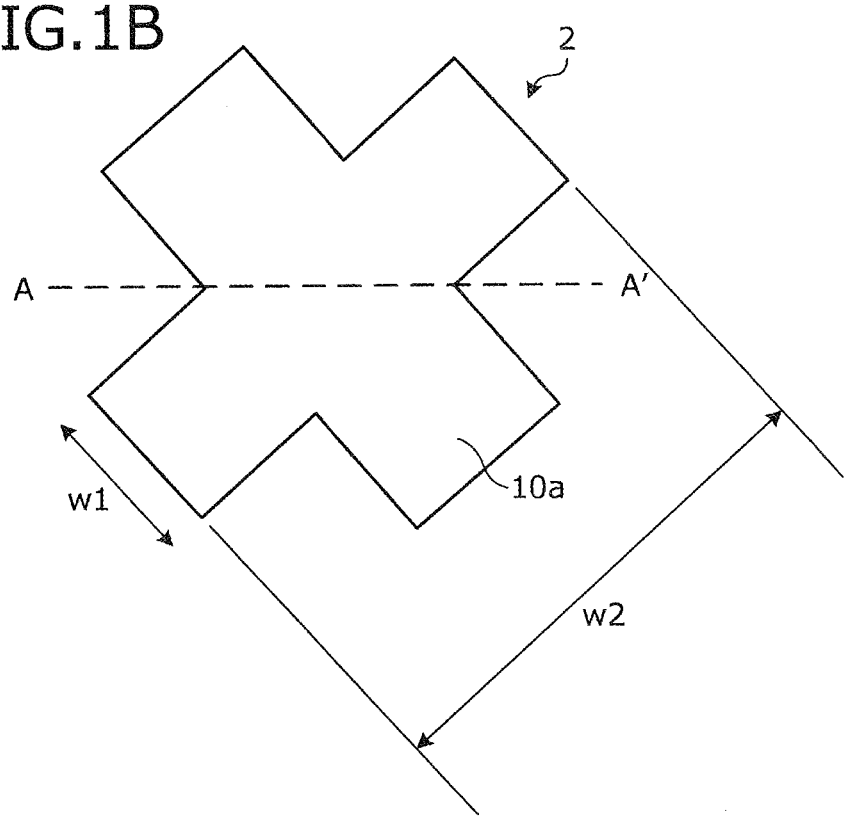

A fabrication method of a silicon carbide semiconductor element according to a first embodiment of the present invention will be described. FIGS. 1A and 1B are explanatory views of a state during fabrication of silicon carbide semiconductor element according to the first embodiment of the present invention. FIG. 1A is a cross-sectional view of main components, taken along a cut line A-A' of FIG. 1B, and depicts a state of an alignment mark 10 after formation of a p⁻ type epitaxial layer 2. FIG. 1B is a plane view of a plane shape of the alignment mark 10.

First, an n⁻ type silicon carbide monocrystal substrate (hereinafter referred to as an n⁻ type silicon carbide substrate) 1 is prepared that includes four-layer cycle hexagonal crystals of silicon carbide (4H—SiC), with an n⁻ type silicon carbide epitaxial layer on one principal surface, for example. The principal plane of the n⁻ type silicon carbide substrate 1 is a (000-1) C-plane having an off-angle θ in a <11-20> direction. For example, the principal plane of the n⁻ type silicon carbide substrate 1 may be the plane having a <0001> c-axis of the n⁻ type silicon carbide substrate 1 tilted by 4 degrees (θ=4) from a normal line direction N in a <11-20> direction.

A mask oxide film is disposed to a thickness of 1 μm on the principal surface of the n⁻ type silicon carbide substrate 1. After photoresist is applied to a surface of the mask oxide film and the photoresist is patterned by exposure and development, the remaining photoresist is baked and cured to form a resist pattern. The resist pattern is used as a mask for dry etching to selectively remove the mask oxide film. The resist pattern is removed by ashing.

As depicted in FIG. 1A, the mask oxide film (not depicted) is used as a mask for dry etching to remove the principal surface layer of the n⁻ type silicon carbide substrate 1 to, for example, a thickness of about 2 μm, such that a periphery of a region provided with the alignment mark 10 is surrounded. In this case, the principal surface layer of the n⁻ type silicon carbide substrate 1 is removed only in, for example, a surrounding range of 100 μm square around the alignment mark 10 to leave the convex-shaped alignment mark 10 surrounded by a region with the n⁻ type silicon carbide substrate 1 removed. For example, the alignment mark 10 is formed in a scribe line of the n⁻ type silicon carbide substrate 1. The alignment mark 10 is a position recognition target used for alignment of multiple photomasks.

The plane shape of the alignment mark 10 is preferably a cross shape including two rectangles having a width w1 of, for example, 5 μm in the lateral direction and a width w2 of, for example, 50 μm in the longitudinal direction orthogonal to each other. The cross-like plane shape of the alignment mark 10 preferably has the longitudinal dimensions of the rectangles making up the plane shape tilted by, for example, 45 degrees, relative to the <11-20> direction (FIG. 1B). This allows the effect of the present invention to notably appear. The mask oxide film is removed by using buffered hydrofluoric acid, for example.

For example, after multiple processes are executed for forming an element structure of a silicon carbide semiconductor element, the p⁻ type epitaxial layer 2 is grown on the principal surface of the n⁻ type silicon carbide substrate 1 to a thickness of, for example, 0.5 μm, to cover the alignment mark 10. In this case, a step portion of an atomic layer is eliminated from an upper surface of the alignment mark 10 to define the entire upper surface of the alignment mark 10 as a {0001} plane terrace portion (hereinafter simply referred to as a terrace portion) 10a. The step portion is a portion of the upper surface of the alignment mark 10, parallel to the principal surface of the n⁻ type silicon carbide substrate 1. The terrace portion 10a is a portion having a gradient relative to the principal surface of the n⁻ type silicon carbide substrate 1.

To eliminate the step portion of the atomic layer from the upper surface of the alignment mark 10 to define the entire upper surface of the alignment mark 10 as the terrace portion 10a, a film thickness of the p⁻ type epitaxial layer 2 is made sufficiently large or a width of the alignment mark 10 parallel to the principal surface of the n⁻ type silicon carbide substrate 1 is made sufficiently small. For example, when a film thickness of the p⁻ type epitaxial layer 2 is Y; a width of the alignment mark 10 parallel to the principal surface of the n⁻ type silicon carbide substrate 1 is X; and an off-angle of the n⁻ type silicon carbide substrate 1 is θ, the respective values are selected to satisfy expression (1). The width X of the alignment mark 10 parallel to the principal surface of the n⁻ type silicon carbide substrate 1 is a length of a diagonal line of a square portion (region) formed by overlapping the two rectangles making up the cross-like plane shape of the alignment mark 10.

$$Y \geq X \cdot \tan \theta \quad (1)$$

Figure 2A:
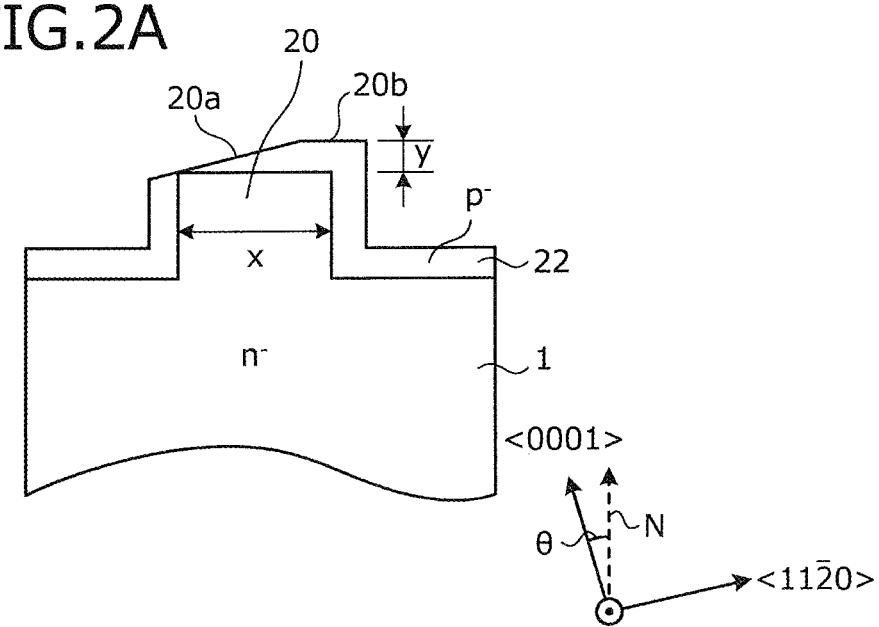
FIGS. 2A and 2B are explanatory views of a state of an alignment mark of a comparison example after epitaxial layer formation.
Figure 2B:
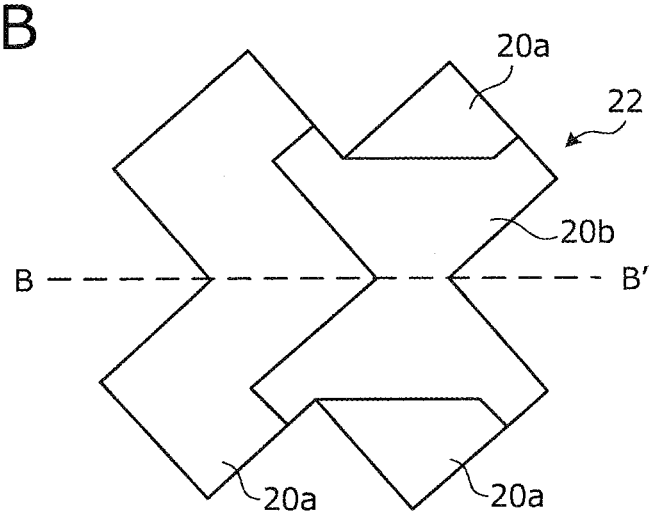
Figure 3:
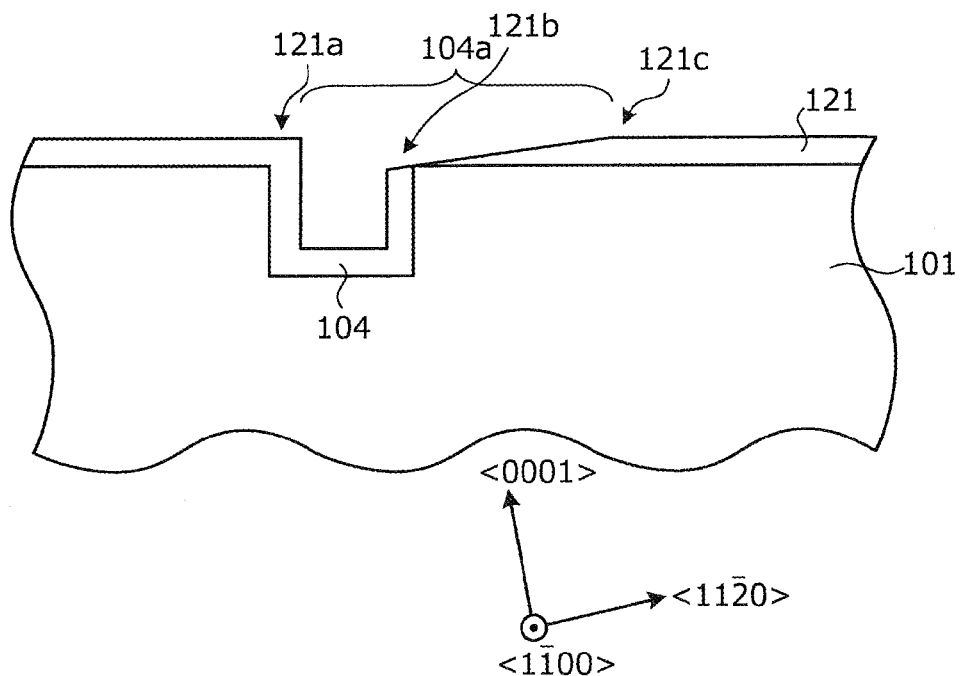
FIG. 3 is a cross-sectional view of a state of a conventional alignment mark after epitaxial layer formation.
Figure 4A:
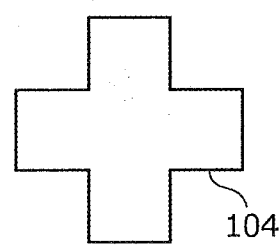
FIGS. 4A and 4B are schematic plane views of a plane shape of a conventional alignment mark after epitaxial layer formation.
Figure 4B:
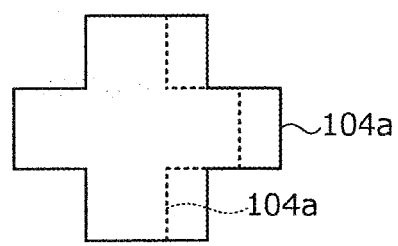
Figure 5:
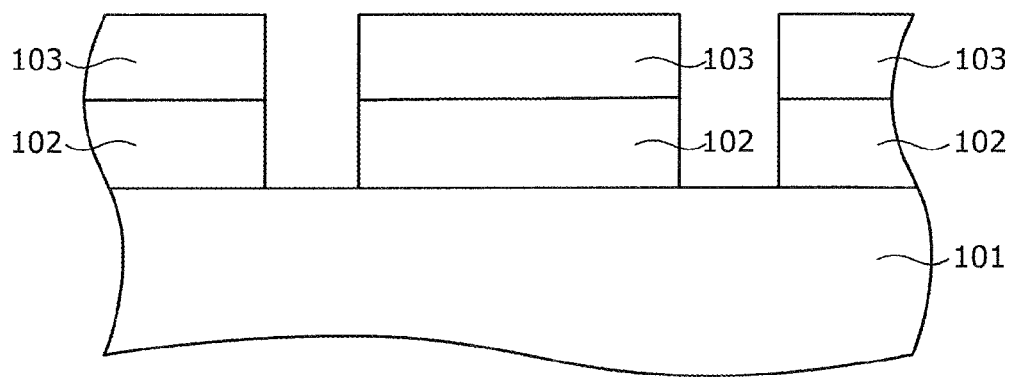
FIG. 5 is a cross-sectional view of a state of a silicon carbide substrate during conventional alignment mark formation.
Figure 6:
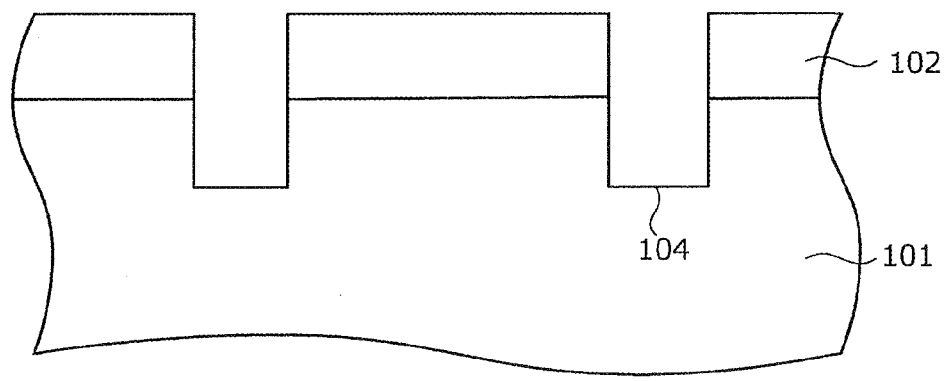
FIG. 6 is a cross-sectional view of a state of the silicon carbide substrate after conventional alignment mark formation.
Figure 7:
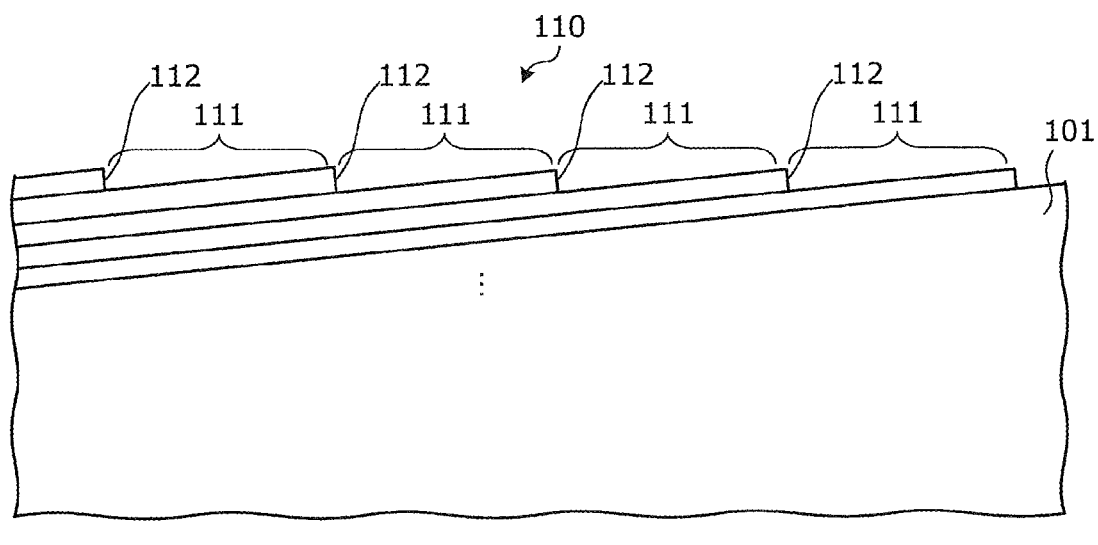
FIG. 7 is a schematic explanatory view of a state of a principal surface of the silicon carbide substrate for epitaxial growth.
Figure 7:
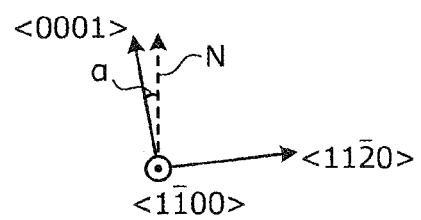

The reason for defining the entire upper surface of the alignment mark 10 as the terrace portion 10a is as follows. FIGS. 2A and 2B are explanatory views of a state of an alignment mark of a comparison example after formation of the epitaxial layer. FIG. 2A is a cross-sectional view taken along a cut line B-B' of FIG. 2B. FIG. 2B is a plane view of a plane shape of an alignment mark 20. As depicted in FIGS. 2A and 2B, if expression (1) is not satisfied, i.e., if the film thickness y of a p⁻ type epitaxial layer 22 is too small or the width X of the alignment mark 20 parallel to the principal surface of the n⁻ type silicon carbide substrate 1 is too large, a {0001} plane terrace portion 20a and a step portion 20b become compounded on the upper surface of the alignment mark 20. Therefore, in the image recognition by a stepper, a boundary between the terrace portion 20a and the step portion 20b is recognized as a contour of the alignment mark 20, causing photomask deviation.

On the other hand, if expression (1) is satisfied, the stepper recognizes a cross-shaped contour of a convex portion of the alignment mark 10 as an image without change and therefore, almost no photomask deviation occurs. For example, if the alignment mark 10 is formed according to the first embodiment described above by setting the off-angle θ of the n⁻ type silicon carbide substrate 1 to 4 degrees and the film thickness Y of the p⁻ type epitaxial layer 2 to 0.5 μm, a maximum value Xmax of the width X of the alignment mark 10 parallel to the principal surface of the n⁻ type silicon carbide substrate 1 is 7.15 μm (=0.5/tan(4 degrees)) and therefore, X≤7.15 μm must be satisfied. As a result of producing an example in which the alignment mark 10 is formed according to the first embodiment, the width X of the alignment mark 10 parallel to the principal surface of the n⁻ type silicon carbide substrate 1 is 7.07 μm, which satisfies expression (1), and the contour of the alignment mark 10 is correctly recognized by the stepper.

As described above, according to the first embodiment, by defining the (000-1) C-plane of the silicon carbide substrate having the off-angle θ in the <11-20> direction as the principle plane, selectively removing the periphery of the portion defined as the alignment mark on the principle surface layer of the silicon carbide substrate to leave the convex-shaped alignment mark, and forming the epitaxial layer on the upper surface of the alignment mark such that expression (1) is satisfied, positional deviation of the alignment mark and deformation of the contour of the alignment mark do not occur before or after the formation of the epitaxial layer onto the upper surface of the alignment mark. As a result, when the alignment mark is used as the position recognition target of the photomasks and is recognized as an image by the stepper, the contour of the alignment mark can correctly be recognized by the stepper. Since this eliminates the necessity of forming a wide cell pitch with consideration of positional deviation of the alignment mark, the cell pitch can be made narrower. Therefore, reductions in the size of the silicon carbide semiconductor element can be achieved.

Second Embodiment

The fabrication method of a silicon carbide semiconductor element according to a second embodiment will be described. The fabrication method of a silicon carbide semiconductor element according to the second embodiment is different from the fabrication method of a silicon carbide semiconductor element according to the first embodiment in that a silicon carbide epitaxial layer grown convexly into a cross-like plane shape on a principal surface of an n⁻ type silicon carbide substrate is defined as an alignment mark. For example, in the fabrication method of a silicon carbide semiconductor element according to the second embodiment, the alignment mark is formed as follows.

First, as is the case with the first embodiment, an n⁻ type silicon carbide substrate is prepared that has an n⁻ type silicon carbide epitaxial layer on one principal surface. For example, a tantalum carbide (TaC) film is formed on the principal surface of the n⁻ type silicon carbide substrate on the n⁻ type silicon carbide epitaxial layer side. The tantalum carbide film may be formed by direct sputtering or may be formed by annealing in raw material gas including carbon (C) such as propane ($C_3H_8$) after sputtering of tantalum on the principal surface of the n⁻ type silicon carbide substrate.

As is the case with the first embodiment, after the formation of the resist pattern by application, exposure, development, and baking of photoresist, the resist pattern is used as a mask for etching to selectively remove the tantalum carbide film. As a result, an alignment mark formation region is exposed in an opening portion of the tantalum carbide film. The resist pattern is removed by ashing. A silicon carbide epitaxial layer (first epitaxial layer) is grown on the principal surface of the n⁻ type silicon carbide substrate exposed in the opening portion of the tantalum carbide film. The silicon carbide epitaxial layer grown in the opening portion of the tantalum carbide film is the alignment mark. The plane shape and the dimension of the alignment mark are the same as the first embodiment.

The silicon carbide epitaxial layer has a film thickness increasing from the upstream side to the downstream side of the step-flow growth along the <11-20> direction and the film thickness is maximized at the most downstream side. Since the tantalum carbide film surrounds the periphery of the n⁻ type silicon carbide substrate principal surface on which the silicon carbide epitaxial layer is grown, the step-flow of silicon carbide on the most upstream side is suppressed and a {0001} plane terrace portion emerges. As the film thickness of the silicon carbide epitaxial layer increases, a width of the terrace portion expands from the upstream side to the downstream side.

If the film thickness of the silicon carbide epitaxial layer is not sufficiently large, the {0001} plane terrace portion emerges on the upstream side of an alignment mark upper surface; however, a step portion still exists on the downstream side of the alignment mark upper surface. Therefore, the silicon carbide epitaxial layer is not grown on the surface of the tantalum carbide film and is grown only on the principal surface of the n⁻ type silicon carbide substrate exposed in the opening portion of the tantalum carbide film while widening a width of the terrace portion. A conductivity type and an impurity concentration of the silicon carbide epitaxial layer are variously changed.

For example, the tantalum carbide film is removed by using buffered hydrofluoric acid and, as is the case with the first embodiment, for example, after the multiple processes are executed for forming the element structure of the silicon carbide semiconductor element, a p⁻ type epitaxial layer (second epitaxial layer) is grown to a thickness of 0.5 μm, for example. In this case, as is the case with the first embodiment, the film thickness Y of the p⁻ type epitaxial layer, the width X of the alignment mark parallel to the principal surface of the n⁻ type silicon carbide substrate, and the off-angle θ of the n⁻ type silicon carbide substrate are selected to satisfy expression (1). As a result, as is the case with the first embodiment, the terrace portion can be formed on the entire upper surface of the alignment mark.

As described above, according to the second embodiment, by defining the (000-1) C-plane of the silicon carbide substrate having the off-angle θ in the <11-20> direction as the principle plane, forming the convex-shaped alignment mark projected from the principal surface of the silicon carbide substrate, and forming the epitaxial layer on the upper surface of the alignment mark such that expression (1) is satisfied, the same effects as the first embodiment can be obtained.

Third Embodiment

The fabrication method of a silicon carbide semiconductor element according to a third embodiment will be described. The fabrication method of a silicon carbide semiconductor element according to the third embodiment is different from the fabrication method of a silicon carbide semiconductor element according to the first embodiment in that an alignment mark recessed in a concaved shape from the principle surface of the n⁻ type silicon carbide substrate is formed and that a region including the alignment mark is coated with a tantalum carbide film. For example, in the fabrication method of a silicon carbide semiconductor element according to the third embodiment, the alignment mark is formed as follows.

In the third embodiment, first, as is the case with the first embodiment, a mask oxide film deposited on the principal surface of the n⁻ type silicon carbide substrate is patterned by photolithography and etching. In the third embodiment, the mask oxide film is formed with an alignment mark formation region opened. The mask oxide film is used as a mask for dry etching to selectively remove the n⁻ type silicon carbide substrate to form the concave-shaped alignment mark.

A region including the alignment mark is coated with a tantalum carbide film. The region including the alignment mark is a region within a surrounding range of 100 μm square around the alignment mark, for example. A side wall and a bottom surface of the alignment mark may be coated with the tantalum carbide film. A p⁻ type epitaxial layer is then grown on the principal surface of the n⁻ type silicon carbide substrate. Since the p⁻ type epitaxial layer does not grow in the region including the alignment mark coated with the tantalum carbide film, a groove having the same plane shape as the alignment mark is formed in a surface layer of the p⁻ type epitaxial layer.

As described above, according to the third embodiment, by defining the (000-1) C-plane of the silicon carbide substrate having the off-angle θ in the <11-20> direction as the principle plane, forming the concave-shaped alignment mark in the principal surface layer of the silicon carbide substrate, and coating the region including the alignment mark with the tantalum carbide film, the same effects as the first embodiment can be obtained.

EXAMPLE

Tests were conducted for a cell pitch of a silicon carbide semiconductor element manufactured according to the fabrication method of a silicon carbide semiconductor element of the embodiments of the present invention. First, an alignment mark was formed according to the first embodiment, and a MOSFET was produced by using the alignment mark as a position recognition target used for alignment of multiple photomasks (hereinafter referred to as Example 1). A MOSFET was also produced by using a conventional alignment mark as the position recognition target (hereinafter referred to as a comparison example).

As a result, in a conventional example, reductions in cell pitch could only be achieved to 15 μm. On the other hand, in Example 1, cell pitch could be reduced to 8 μm. As described above, since reductions in size were further be achieved as compared to the conventional example, the ON-resistance of the Example could be significantly reduced to 4.0 mΩcm² from the ON-resistance of 5.6 mΩcm² of the conventional example. It was confirmed that MOSFETs produced by using the alignment marks formed according to the second and third embodiments as the position recognition targets could produce the same effects as Example 1.

The present invention is not limited to the embodiments described above and can variously be changed within a range not departing from the spirit of the present invention. For example, the present invention can be implemented even when the p-type and the n-type are interchanged or when the silicon carbide substrate and the epitaxial layer grown on the silicon carbide substrate principal surface are of the same conductivity type.

INDUSTRIAL APPLICABILITY

As described above, the fabrication method of a silicon carbide semiconductor element according to the present invention is useful for a silicon carbide semiconductor element using silicon carbide as a semiconductor material and is particularly suitable for a vertical power device semiconductor element to which current is applied from a front surface side to a back surface side of a semiconductor substrate.

EXPLANATIONS OF LETTERS OR NUMERALS 1 n⁺ type silicon carbide substrate
2 p⁻ type epitaxial layer
10 alignment mark
10a {0001} plane terrace portion
X width of an alignment mark parallel to a principal surface of an n⁻ type silicon carbide substrate
Y film thickness of a p⁻ type epitaxial layer
θ off-angle of the n⁻ type silicon carbide substrate 1
w1 lateral width of a rectangle making up a cross-like plane shape of an alignment mark
w2 longitudinal width of a rectangle making up a cross-like plane shape of an alignment mark

The invention claimed is:

1. A fabrication method of a silicon carbide semiconductor element, the fabrication method comprising:

defining a plane of a silicon carbide substrate having a <0001> c-axis tilted by θ from a normal line direction of a principal plane of the silicon carbide substrate in a <11-20> direction as the principal plane and removing a principal surface layer of the silicon carbide substrate such that a periphery of a region in which an alignment mark is provided is surrounded so as to leave a convex-shaped alignment mark; and growing an epitaxial layer on the principal surface layer of the silicon carbide substrate to cover the alignment mark, wherein a width X of the alignment mark parallel to the principal surface of the silicon carbide substrate satisfies $Y \geq X \cdot \tan \theta$ in terms of a relationship with a film thickness Y of the epitaxial layer.

2. A fabrication method of a silicon carbide semiconductor element, the fabrication method comprising:

defining a plane of a silicon carbide substrate having a <0001> c-axis tilted by θ from a normal line direction of a principal plane of the silicon carbide substrate in a <11-20> direction as the principal plane and coating with a tantalum carbide film, a region of a principal surface layer of the silicon carbide substrate other than a region in which an alignment mark is provided;

growing a convex-shaped first epitaxial layer acting as an alignment mark on the principal surface of the silicon carbide substrate, on a side coated with the tantalum carbide film;

removing the tantalum carbide film; and growing a second epitaxial layer on the principal surface of the silicon carbide substrate to cover the alignment mark, wherein a width X of the alignment mark parallel to the principal surface of the silicon carbide substrate satisfies $Y \geq X \cdot \tan \theta$ in terms of a relationship with a film thickness Y of the second epitaxial layer.

3. A fabrication method of a silicon carbide semiconductor element, the fabrication method comprising:

defining a plane of a silicon carbide substrate having a <0001> c-axis tilted from a normal line direction of a principal plane of the silicon carbide substrate to a <11-20> direction as the principal plane and selectively removing a principal surface layer of the silicon carbide substrate to form a concave-shaped alignment mark;

coating with a tantalum carbide film, a region of the principal surface of the silicon carbide substrate including the alignment mark; and growing an epitaxial layer on the principal surface of the silicon carbide substrate selectively coated with the tantalum carbide film.

4. The fabrication method of a silicon carbide semiconductor element of claim 1, wherein the alignment mark is formed in a cross-like plane shape such that two rectangles having longitudinal dimensions tilted by 45 degrees relative to the <11-20> direction are orthogonal to each other.

5. The fabrication method of a silicon carbide semiconductor element of claim 2, wherein the alignment mark is formed in a cross-like plane shape such that two rectangles having longitudinal dimensions tilted by 45 degrees relative to the <11-20> direction are orthogonal to each other.

6. The fabrication method of a silicon carbide semiconductor element of claim 3, wherein the alignment mark is formed in a cross-like plane shape such that two rectangles having longitudinal dimensions tilted by 45 degrees relative to the <11-20> direction are orthogonal to each other.

* * * * *